DOPING A PULLED SEMICONDUCTOR CRYSTAL WITH IMPURITIES HAVING DIFFERENT DIFFUSION COEFFICIENTS
Filed May 8, 1958

Inventor
Reona Ezaki
by Wolfe, Hubbard, Leydig, Voit & Osann, Attys

United States Patent Office 3,150,017
Patented Sept. 22, 1964

3,150,017
DOPING A PULLED SEMICONDUCTOR CRYSTAL WITH IMPURITIES HAVING DIFFERENT DIFFUSION COEFFICIENTS

Reona Ezaki, Tokyo, Japan, assignor to Sony Corporation, a corporation of Japan

Filed May 8, 1958, Ser. No. 733,948
Claims priority, application Japan June 29, 1957
1 Claim. (Cl. 148—172)

This invention relates to a method of making a semiconductor device and more partcuilarly to a method of making a p-n-p or n-p-n single crystal adapted for grown type transistors, photo-transistors, tetrode transistors and especially transistors used in high frequencies.

One of the necessary conditions of a junction type single crystal which is available to grown type transistors of high frequency use is to obtain a thin width of the sandwiched layer that is, the base. The α-cutoff frequency of a transistor can be expressed by the following formula:

$$f_{\alpha}^{co}=\frac{D_p}{W^2} \quad \text{(for the p-n-p type)}$$

$$=\frac{D_n}{W^2} \quad \text{(for the n-p-n type)}$$

where $D_p$: Diffusion constant of holes
$D_n$: Diffusion constant of electrons
W: Width of the base A junction type single crystal employed for grown type transistors has usually been manufactured by the double dope method in which impurities are doped twice during pulling operation of the crystal, the rate grown method in which the pulling rate of the crystal is changed according to the applied temperature, the surface melt method or the like. It is, however, impossible to control the base width W to the order of less than 10 microns.

This invention intends to provide a method of making a junction type crystal having the desired base of less than 10 microns in width and relatively low resistivity based upon both the difference of the diffusion coefficient of the impurity to the semiconductor solid and much reduction of the diffusion coefficient by lower operating temperature than melting point of the semiconductor.

In accordance with this invention, the method comprises dissolving a portion of such a semiconductor crystal as germanium and silicon, which is previously prepared, into a melt of two metals which become donors and acceptors in the semiconductor crystal, and regrowing slowly semiconductor crystal from solid-liquid interface under temperature control. In the process of the said regrowth, a p-n-p structure for germanium or a n-p-n structure for silicon, having thin sandwich layer, is formed.

One object of this invention is to provide a method of making a p-n-p or n-p-n single crystal of which a sandwich layer is less than 10 microns.

Another object of this invention is to provide a method of making a semiconductor device which enables to obtain transistors adapted for switching operation.

A further object of this invention is to provide a method of a semiconductor device which enables to obtain transistors having superior high frequency response.

Other object, features and advantages of the present invention will be more fully apparent from the following detailed description taken in connection with the accompanying drawing, in which.

Figure 4:
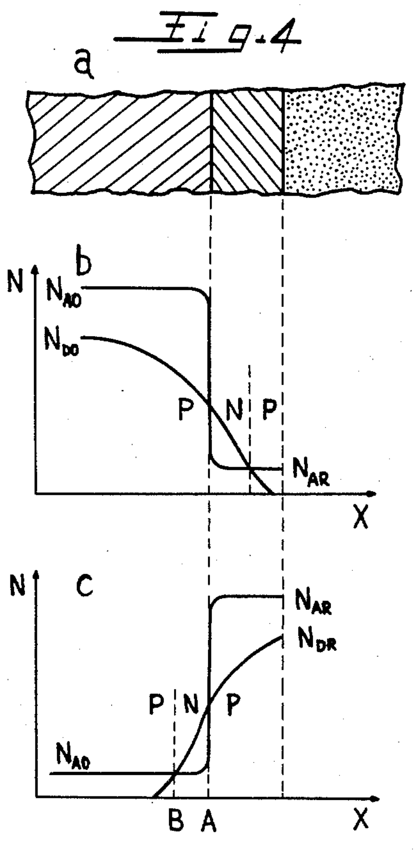

FIG. 4–*a* is an enlarged sectional view of a single crystal having a recrystalized layer.

Figure 5:
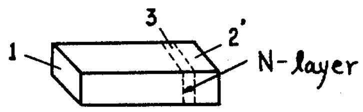

FIG. 4–*b*–*c* shows curves for illustrating the variation of impurity concentration in respect with the place of the crystal shown in FIG. 4–*a*, and FIG. 5 shows a perspective view of a bar formed by cutting a p-n-p crystal made by the method according to this invention.

One embodiment of this invention will be taken in connection with making of a p-n-p junction type single crystal.

First, a p-type germanium single crystal of 1 cm. to 2 cm. in diameter having resistivity of 0.5 to 3 ohm-cm. is previously prepared so as to be the collectors of transistors. Next, 30 grams of indium and 0.1 to 3 grams of antimony in a graphite crucible are melt in an inert atmosphere. The heating temperature of the alloy is controlled at for example about 800° C. Then the previously prepared p-type single crystal ingot is immersed into the melt and one part of germanium is dissolved thereinto until the equilibrium condition of the solid and liquid phases is obtained. Finally, the ingot is pulled according to the ordinary pulling operation under the accurate temperature control and the pulling speed being from several to several ten microns per second, to regrow the crystal.

Figure 1:
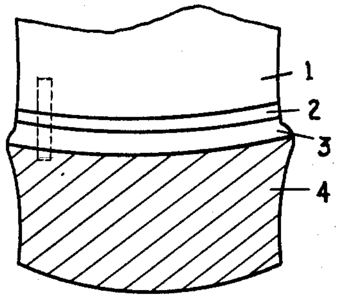
FIG. 1 shows a sectional view of a single crystal obtained by the method according to this invention. A portion surrounded with dotted line is used to a transistor element.

FIG. 1 shows the sectional view of a single crystal thus obtained. The region 1 is the part of the p-type single crystal previously prepared. The region 2 is the thin n-type layer formed by diffusion in the regrowing process of the crystal owing to the appreciably large diffusion coefficient of antimony as compared with that of indium. The region 3 is the regrowth germanium crystal and is of p-type as it contains more indium than antimony. The region 4 is the mixture of p-type germanium polycrystals, indium and antimony in metallic state.

A part surrounded by the dotted line is cut to assemble transistor in the same way as the usual grown type transistor.

The width of the layer 2 can be controlled by the operating temperature at which the diffusion process is carried, so that a grown type crystal having any desired base width can be obtained. Neutral elements such as lead, tin or the like can be added into the melt in the above mentioned operation, if desired.

Figure 2:
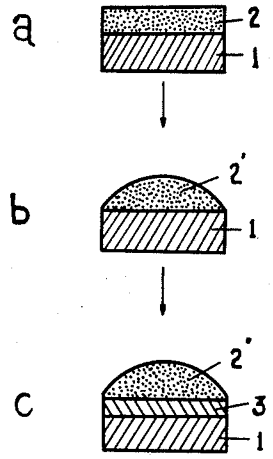
FIG. 2 shows schematic diagrams illustrating one process according to the method of this invention.

Another embodiment of this invention will be explained referring to FIG. 2. On a p-type germanium piece 1 of 1 to 3 ohm-cm. having the diameter of 10 to 20 mm. and the height of 5 to 10 mm. formed by cutting an ingot is placed an acceptor impurity metal such as indium and donor impurity metal such as antimony or neutral impurity metal such as lead, if desired, as shown in FIG. 2–*a*. The specimen is heated from the top thereof in an inert gas or the vacuum. Initially metals put on the germanium are melted and then a mixed melt 2′ is obtained as shown in FIG. 2–*b*. Then the mixed melt is gradually cooled to form a recrystallized single crystal layer 3 having the thickness of order of 0.1 mm. on the mother germanium piece as shown in FIG. 2–*c*.

Figure 3:
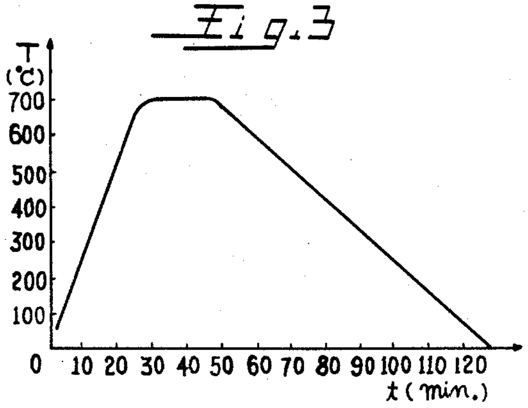
FIG. 3 shows a curve illustrating an example of temperature schedule adopted to the method of this invention.

FIG. 3 shows a curve illustrating an example of temperature schedule.

In this case, it is needed to control the operating temperature in order to obtain a comparatively perfect recrystallized single crystal having the uniform width.

Now, we choose a p-type germanium piece of the order of 0.01 ohm-cm. containing comparatively large amount of both the acceptor and donor.

In this case, lead containing a slight amount of the acceptor is preferred as a pre-melting metal.

FIG. 4–*a* shows an enlarged representation of the recrystallized portion 3 and FIG. 4–*b* illustrates the variation of the impurity concentration with the place of the crystal. The curves $N_{AO}$ and $N_{DO}$ show respectively acceptor and donor concentrations contained in the mother germanium piece, while the curve $N_{AR}$ shows the acceptor concentration in the recrystallized layer.

Generally, the donor impurities such as phosphorus, arsenic, antimony, bismuth and the like has larger diffusion coefficient than that of the acceptor impurities such as boron, gallium, indium, thallium and the like in germanium so that such a donor impurity diffuses rapidly to the depth of several microns in the heating cycle to give the donor distribution shown in FIG. 4–*b*.

The donor concentration $N_D$ is represented as the solution of Fick's diffusion equation by the following formula:

$$N_D = \frac{N_{DO}}{}\left(1 - \Phi\left(\frac{x}{2\sqrt{D_t}}\right)\right)$$

$$(t) = \frac{2}{\sqrt{t}} \int_0^t e^{-y^2} d\xi$$

where

X: Distance from the point A
D: The diffusion coefficient at a certain temperature
*t:* Diffusion time
Φ: Error function Owing to such diffusion of the donor impurity, the thin layer AB of 2 to 4 microns becomes n-type to form p-n-p junction. It is more advantageous to use the mother germanium piece as the emitter, and the recrystallized layer side as collector since the impurity concentration distribution acts to accelerate the minority carrier in this case. The recrystallized layer has the thickness of 100 microns or less and is connected to lead alloy layer so that the collector spreading resistance $r'_c$ is very small. Accordingly, such a junction is available to make a transistor adapted for switching operation.

Next, we choose a p-type germanium piece of comparatively higher purification, that is, of the order of 1 ohm-cm. In this case, lead containing gallium and antimony or indium containing antimony is preferred as a premelting metal.

FIG. 4–*c* shows the variation of the impurity concentration with the place. The curves $N_{AR}$ and $N_{DR}$ show respectively the acceptor and donor concentration in the recrystallized layer. Owing to the same reason as described above, the thin layer AB of 2 to 4 microns becomes n-type by the diffusion of the donor impurity to form a p-n-p junction. In this case, it will be apparent from the impurity distribution in the base that the recrystallized side is used as the emitter and the original germanium side as the collector with the result of advantage. Moreover, the recrystallized layer is directly connected to the lead alloy or indium so that the emitter spreading resistance $r'_e$ is very small.

FIG. 5 shows a bar of about 0.2 mm. square obtained by cutting the p-n-p crystal made by the above mentioned method according to this invention. A transistor can be made from the bar by the same handling as in the ordinary grown type transistor. That is, the both sides of the bar is soldered to lead wires and the base lead is made by the usual gold wire bonding or the alloying techniques. It will be apparent that one end of the transistor is lead alloy or indium alloy so that the soldering between the bar and the lead wire can be easily achieved as compared with that in the case of the ordinary grown type transistors and the heat radiation from the collector is effectively attained.

Table 1 shows characteristics of a germanium p-n-p junction type transistor, by way of example, made by using a crystal which is manufactured by heating at 700° C. for about 30 minutes and has the base width of about 3 microns and the following items:

$N_{AO} = 10^{18}$ cm.$^{-3}$
$N_{DO} = 4 \times 10^{17}$ cm.$^{-3}$ ($\rho_e = 0.015$ ohm-cm.)
$N_{AR} = 2 \times 10^{15}$ cm.$^{-3}$ ($\rho_c = 2$ ohm-cm.)

*Table 1*

| Bias | Constant | | | | | | Collector current | |
|---|---|---|---|---|---|---|---|---|
| $V_{cb}$ volts | $I_e$ ma. | $\alpha$ | $f_c$ mc. | $C_c$ $\mu\mu$f. | $r'_b$ ohms | $f_{max.}$ mc. | $I_{co}$ $\mu$a. | $V_{cb}$ volts |
| 15 | 1 | 0.95 | 200 | 1 | 50 | 300 | 1 | 15 |

It will be seen from the table that a transistor of superior high frequency response can be obtained by the method according to this invention.

The donor impurity such as arsenic, antimony, bismuth and the like has smaller diffusion coefficient than that of the acceptor impurities such as aluminium, gallium, indium and the like silicon so that n-p-n type transistors having superior high frequency response can be equally obtained based upon the same principle of this invention by only respectively substituting the acceptor and donor in germanium for the donor and acceptor.

It is said that indium has the distribution coefficient of 0.001 at the melting point of germanium, 936° C., but from our experiment the distribution coefficient thereof seems reduced by about one order at about 800° C.

While I have explained a particular embodiment of my invention, it will be limited thereto since many modifications may be made and I, therefore, contemplate by the appended claim to cover any such modifications as within the spirit and scope of my invention.

What is claimed is:

A method of making a semiconductor device comprising dissolving a portion of a relatively high resistivity p-type germanium single crystal into a molten mixture consisting of a low diffusion coefficient accepter impurity and a high diffusion coefficient donor impurity to the state of liquid-solid equilibrium and then slowly withdrawing said crystal and regrowing gradually a p-type single crystal germanium layer from the liquid-solid interface under accurately controlled temperature during a heating cycle in which the said high diffusion coefficient donor impurity diffuses further into the original p-type germanium single crystal, whereby a p-n-p germanium grown crystal, having a sandwiched n-type layer of less than 10 microns thickness and suitable for use as a high frequency, grown transistor, is formed.

References Cited in the file of this patent

UNITED STATES PATENTS

| | | |
|---|---|---|
| 2,809,135 | Koury | Oct. 8, 1957 |
| 2,836,521 | Longini | May 27, 1958 |
| 2,847,335 | Gremmelmaier et al. | Aug. 12, 1958 |
| 2,852,420 | Pohl | Sept. 16, 1958 |

FOREIGN PATENTS

| | | |
|---|---|---|
| 755,845 | Great Britain | Aug. 29, 1956 |
| 779,666 | Great Britain | July 24, 1957 |